United States Patent [19]
Oota et al.

[11] Patent Number: 5,450,338
[45] Date of Patent: Sep. 12, 1995

[54] ADD-COMPARE-SELECT DEVICE

[75] Inventors: Kazuhiro Oota, Osaka; Kimura: Tomohiro, Kawachinagano; Yasuo Nagaisi, Ikoma, all of Japan

[73] Assignee: Matsushita Electric Industrial Co., Ltd., Kadome, Japan

[21] Appl. No.: 247,982

[22] Filed: May 23, 1994

[30] Foreign Application Priority Data

May 28, 1993 [JP]  Japan .................................. 5-127167

[51] Int. Cl.⁶ .......................... G06F 7/38; G06F 11/10
[52] U.S. Cl. ..................... 364/715.1; 371/43
[58] Field of Search ........................... 364/715.01, 736; 371/43

[56] References Cited

U.S. PATENT DOCUMENTS 4,763,328  8/1988  Shimoda et al. .................. 371/43
5,150,369  9/1992  Costa et al. ...................... 371/43
5,272,706  12/1993  Park .................................. 371/43
5,341,386  8/1994  Shimoda et al. .................. 371/43
5,349,608  9/1994  Graham et al. ................... 371/43

Primary Examiner—David H. Malzahn
Attorney, Agent, or Firm—Beveridge, DeGrandi, Weilacher & Young

[57] ABSTRACT

An add-compare-select device capable of generating a plurality of new path metrics at each point in time on the basis of prescribed combinations between a plurality of input branch metrics and a plurality of stored path metrics, thereby to handle high data transmission rates: is disclosed wherein simplified addition and comparison operations on branch metrics and path metrics are performed concurrently with usual operations for adding these metrics, thereby accomplishing a reduction in the signal processing time.

11 Claims, 14 Drawing Sheets

FIG. I

ADD-COMPARE-SELECT DEVICE

BACKGROUND OF THE INVENTION

1. Field of the Invention

The present invention relates to an ACS (add-compare-select) device used, for example, in a Viterbi decoder that performs maximum-likelihood decoding of a convolutionally encoded data sequence.

2. Background of the Invention

Usually, in a Viterbi decoder, a convolutionally encoded data sequence is input, and for each input symbol, all possible nonencoded data sequences that satisfy the coding rule are estimated; then, several data sequences considered likely among the estimated data sequences are stored as paths, while the oldest symbol on the most likely of all the paths is obtained.

This decoding operation is described in detail in "Convolutional Codes and Their Performance in Communication Systems," IEEE TRANSACTIONS ON COMMUNICATIONS TECHNOLOGY, October 1971.

In the Viterbi decoding process, the likelihood of a path is represented by the path metric, the likelihood increasing with decreasing path metric. The path metric is obtained by summing the branch metrics, calculated for each symbol, along the branches.

More specifically, the Viterbi decoder performs ACS (add, compare, select) operations in which the branch metrics calculated at each point and the path metrics so far stored are added together in several combinations to obtain new path metric candidates, which are compared in several combinations so that the smaller one in each combination is selected and stored as the new path metric.

The circuit that performs the add, compare, and select operations is known as the add-compare-select circuit.

In the prior art, there is provided an add-compare-select circuit comprising: adding means for adding branch metrics and path metrics in prescribed combinations, thereby obtaining new path metric candidates; comparing means for comparing the thus obtained new path metrics; selecting means for selecting, on the basis of the comparison, the path metric candidate presented by the result of the addition in the adding means that corresponds to the simplified path metric judged as being the smallest; and storing means for storing the thus selected new path metric for use as a path metric at the next point in time.

This add-compare-select circuit is described in detail in "VLSI Architectures for Metric Normalization in the Viterbi Algorithm," IEEE CH2829-0/90, 1990.

In the prior art add-compare-select device having the above configuration, the operations of comparing the results of the additions and selecting an addition result based on the results of the comparisons are performed in a sequential manner within a given point in time.

However, addition and comparison operations generally involve a very long signal processing time; therefore, when the addition and comparison operations are performed in a sequential manner, the signal processing time becomes very long, limiting the rate of Viterbi decoding, etc. and making it imperative to reduce the data transmission rate.

SUMMARY OF THE INVENTION

It is an object of the present invention to provide an add-compare-select device capable of reducing the signal processing time and increasing the data transmission rate.

An add-compare-select device of the present invention generates a plurality of new path metrics at each point in time on the basis of prescribed combinations between a plurality of input branch metrics and a plurality of stored path metric. And the present invention comprises adding means for adding said branch metrics and said path metrics in said prescribed combinations, thereby obtaining new path metric candidates; simplified calculating means for performing a simplified operation, as compared to an addition operation of said adding means, on said branch metrics and said path metrics in said prescribed combinations, thereby obtaining simplified path metrics; comparing means for comparing a plurality of simplified path metrics thus obtained; selecting means for selecting a path metric candidate presented by a result of the addition in said adding means, the selected path metric candidate corresponding to the simplified path metric judged as being the smallest on the basis of a result of the comparisoning; and storing means for storing the thus selected path metric candidate for use as a new path metric at the next point in time.

In the above configuration, according to the present invention, the simplified path metrics obtained by the simplified Operation are compared, and the path metric candidate presented by the result of the addition in the adding means that corresponds to the simplified path metric judged as being the smallest is selected on the basis of the result of the comparison. Accordingly, the invention provides the advantage of reducing the signal processing time and thus increasing the data transmission rate.

DETAILED DESCRIPTION OF THE INVENTION

The present invention will now be described below with reference to the accompanying drawings illustrating the preferred embodiments thereof.

For explanation purposes, each embodiment assumes an add-compare-select device used in a Viterbi decoder with a constraint length 3, code rate ½, 4-bit branch metric, and 6-bit path metric.

(1st Embodiment)

Figure 1:
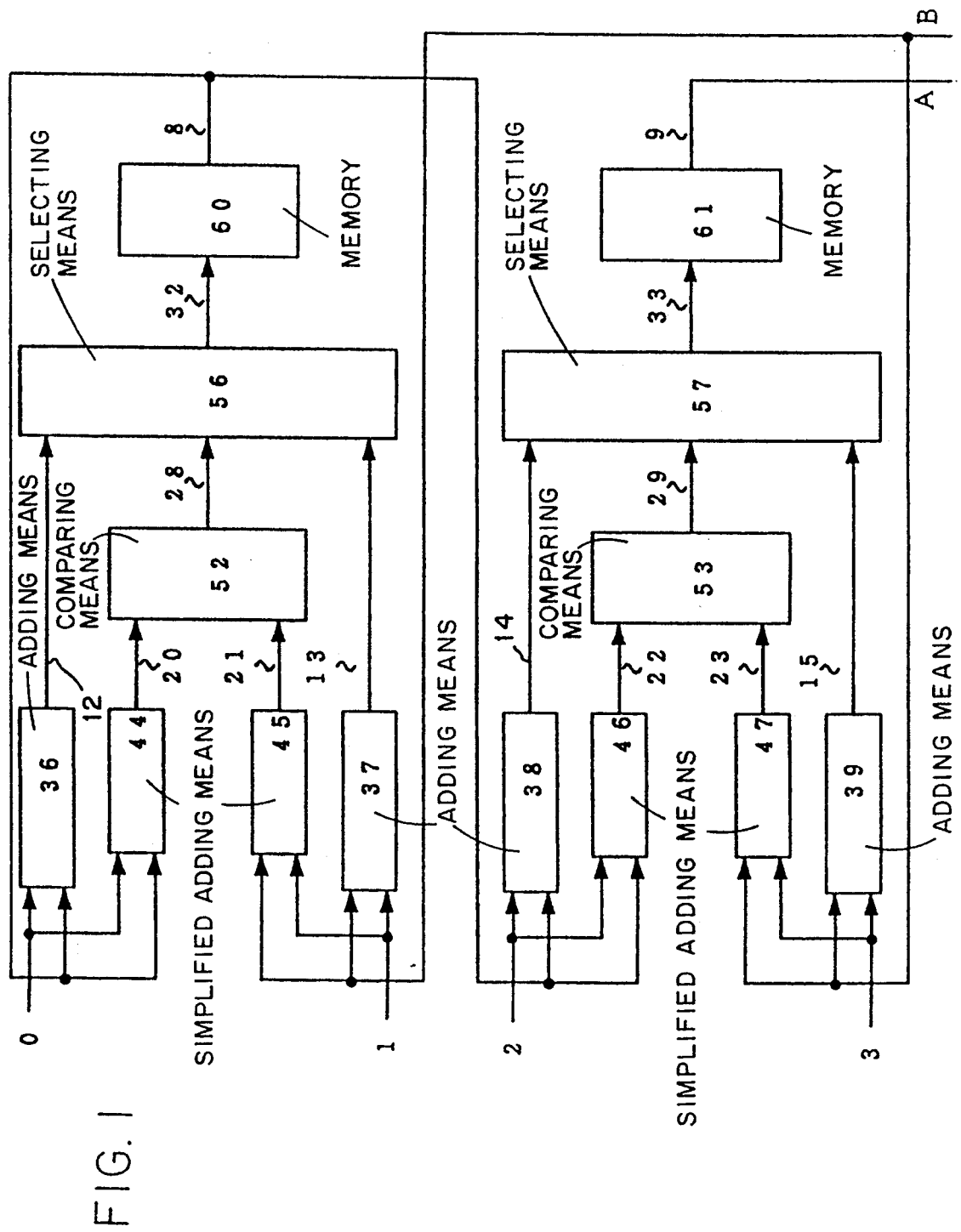
FIG. 1 is a diagram showing the configuration of an add-compare-select device (a portion thereof shown) in a first embodiment according to the present invention.
Figure 2:
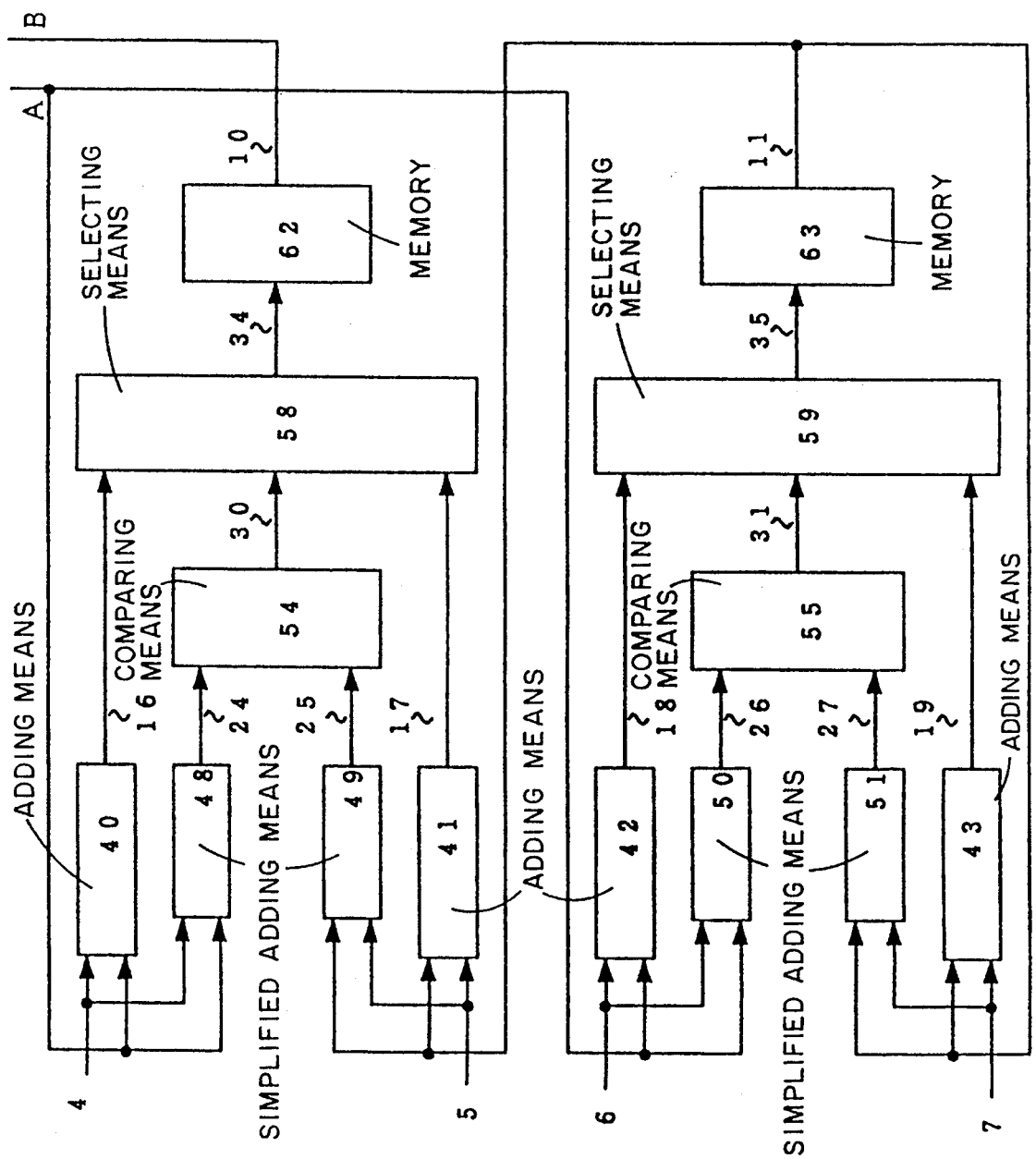
FIG. 2 is a diagram showing the configuration of the add-compare-select device (the remaining portion shown) in the first embodiment according to the present invention.

FIGS. 1 and 2 are diagrams showing the configuration of an add-compare-select device in a first embodiment according to the present invention. In FIGS. 1 and 2, the numerals 0 to 7 are branch metrics input at each point in time; 8 to 11 are path metrics output from memories 60 to 63, respectively; 12 to 19 are new path metric candidates output from adding means 36 to 43, respectively; 20 to 27 are simplified path metrics output from simplified adding means 44 to 51, respectively; 28 to 31 are selection information output from comparing means 52 to 55, respectively; and 32 to 35 are new path metrics output from selecting means 56 to 59, respectively.

Indicated at 36 to 43 are the adding means: the adding means 36 adds a branch metric 0 and a path metric 8 together and outputs a new path metric candidate 12; the adding means 37 adds a branch metric 1 and a path metric 10 together and outputs a new path metric candidate 13; the adding means 38 adds a branch metric 2 and a path metric 8 together and outputs a new path metric candidate 14; the adding means 39 adds a branch metric 3 and a path metric 10 together and outputs a new path metric candidate 15; the adding means 40 adds a branch metric 4 and a path metric 9 together and outputs a new path metric candidate 16; the adding means 41 adds a branch metric 5 and a path metric 11 together and outputs a new path metric candidate 17; the adding means 42 adds a branch metric 6 and a path metric 9 together and outputs a new path metric candidate 18; and the adding means 43 adds a branch metric 7 and a path metric 11 together and outputs a new path metric candidate 19.

Indicated at 44 to 51 are the simplified adding means which correspond to simplified calculating means: the simplified adding means 44 performs a simplified addition on the branch metric 0 and path metric 8 and outputs a simplified path metric 20; the simplified adding means 45 performs a simplified addition on the branch metric 1 and path metric 10 and outputs a simplified path metric 21; the simplified adding means 46 performs a simplified addition on the branch metric 2 and path metric 8 and outputs a simplified path metric 22; the simplified adding means 47 performs a simplified addition on the branch metric 3 and path metric 10 and outputs a simplified path metric 23; the simplified adding means 48 performs a simplified addition on the branch metric 4 and path metric 9 and outputs a simplified path metric 24; the simplified adding means 49 performs a simplified addition on the branch metric 5 and path metric 11 and outputs a simplified path metric 25; the simplified adding means 50 performs a simplified addition on the branch metric 6 and path metric 9 and outputs a simplified path metric 26; and the simplified adding means 51 performs a simplified addition on the branch metric 7 and path metric 11 and outputs a simplified path metric 27.

Indicated at 52 to 55 are the comparing means: the comparing means 52 compares the simplified path metrics 20 and 21 and outputs the resulting information as selection information 28; the comparing means 53 compares the simplified path metrics 22 and 23 and outputs the resulting information as selection information 29; the comparing means 54 compares the simplified path metrics 24 and 25 and outputs the resulting information as selection information 30; and the comparing means 55 compares the simplified path metrics 26 and 27 and outputs the resulting information as selection information 31.

Indicated at 56 to 59 are the selecting means: the selecting means 56 receives the new path metric candidates 12 and 13 and the selection information 28, and based on the selection information 28, outputs as the new path metric 32 the new path metric candidate 12 if the simplified path metric 20 is the smaller of the two simplified path metrics 20 and 21, and the new path metric candidate 13 if the simplified path metric 21 is the smaller of the two; the selecting means 57 receives the new path metric candidates 14 and 15 and the selection information 29, and based on the selection information 29, outputs as the new path metric 33 the new path metric candidate 14 if the simplified path metric 22 is the smaller of the two simplified path metrics 22 and 23, and the new path metric candidate 15 if the simplified path metric 23 is the smaller of the two; the selecting means 58 receives the new path metric candidates 16 and 17 and the selection information 30, and based on the selection information 30, outputs as the new path metric 34 the new path metric candidate 16 if the simplified path metric 24 is the smaller of the two simplified path metrics 24 and 25, and the new path metric candidate 17 if the simplified path metric 25 is the smaller of the two; and the selecting means 59 receives the new path metric candidates 18 and 19 and the selection information 31, and based on the selection information 31, outputs as the new path metric 35 the new path metric candidate 18 if the simplified path metric 26 is the smaller of the two simplified path metrics 26 and 27, and the new path metric candidate 19 if the simplified path metric 27 is the smaller of the two.

Indicated at 60 to 63 are the memories: the memory 60 stores the new path metric 32, and at the next point in time, outputs it as the path metric 8; the memory 61 stores the new path metric 33, and at the next point in time, outputs it as the path metric 9; and the memory 62 stores the new path metric 35, and at the next point in time, outputs it as the path metric 11.

Figure 3:
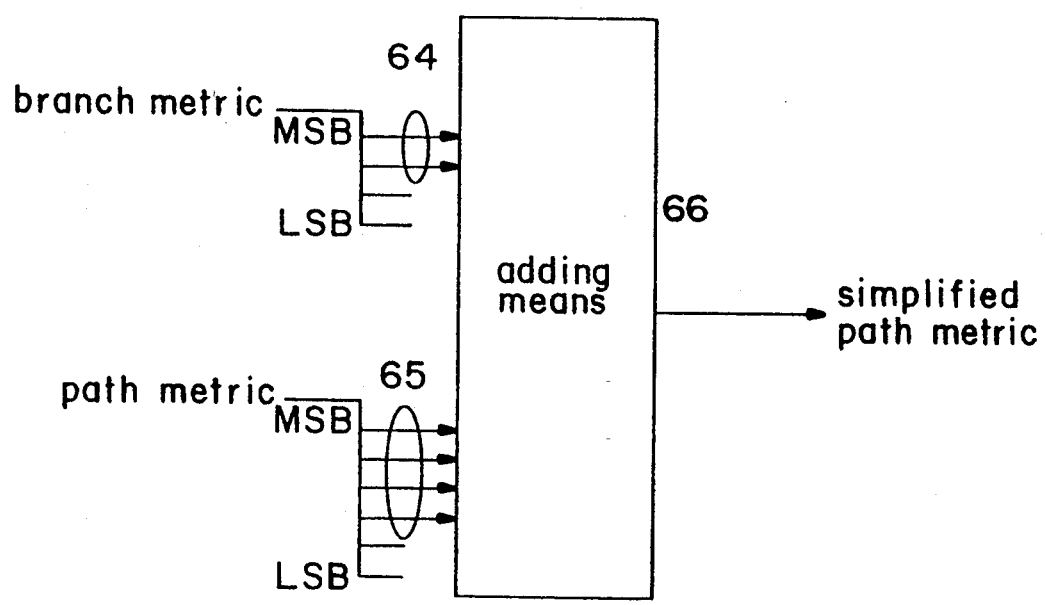
FIG. 3 is a diagram showing the configuration of simplified adding means in the add-compare-select device in the first embodiment.

FIG. 3 is a diagram showing the internal configuration of one of the simplified adding means 44 to 51 in the add-compare-select device according to the first embodiment. In FIG. 3, the numeral 64 designates a data signal representing the high order two bits of the branch metric input to the simplified adding means, and 65 indicates a data signal representing the high order four bits of the path metric input to the simplified adding means. That is, the simplified adding means is constructed to perform an addition using designated high order bits of all the bits of the branch metric and path metric as long as it does not cause ill effect on the decision making process in the selecting means, thus accomplishing a reduction in the add time. The numeral 66 indicates adding means which adds the data signals 64 and 65 and outputs a simplified path metric.

Next, the operation of the add-compare-select device of the first embodiment will be described below.

First, the adding means 36 to 43 add the branch metrics 0 to 7 and the path metrics 8 to 11 in respective combinations, and obtain the new path metric candidates 12 to 19.

Concurrently with the above operation, the simplified adding means 44 to 51 add the branch metrics 0 to 7 and the path metrics 8 to 11 in the same combinations as used in the additions in the adding means 36 to 43, respectively, but by using only the high order bits of the respective metrics, as described with reference to FIG. 2, and obtain the simplified path metrics 20 to 27.

Next, the comparing means 52 to 55 compare the simplified path metrics 20 to 27 and output the selection information 28 to 31, respectively.

Thereafter, based on the selection information 28 to 31, the selecting means 56 to 59 each select one candidate from among the new path metric candidates 12 to 19, and the selected candidates are output as the new path metrics 32 to 35, respectively. Since the combinations between the branch metrics 0 to 7 and path metrics 8 to 11 used in the simplified additions in the simplified adding means 44 to 51 are the same as the combinations between the branch metrics 0 to 7 and path metrics 8 to 11 used in the additions in the adding means 36 to 43, it is possible to select the new path metrics 32 to 35 by using the selection information 28 to 31 obtained from the simplified path metrics 20 to 27.

The new path metrics 32 to 35 output from the selecting means 56 to 59, respectively, are stored in the memories 60 to 63, and are used as the path metrics at the next point in time.

As described, the add-compare-select device of the first embodiment performs the simplified addition and comparison operations concurrently with the usual addition operations performed to obtain the path metrics. This compares with the prior art add-compare-select device in which the addition, comparison, and selection operations are performed in a sequential manner within a given point in time. Since the simplified addition operations are performed using a reduced number of bits, as previously described, the time required for carry propagation reduced, thus achieving a reduction in the signal processing time.

(2nd Embodiment)

Figure 4:
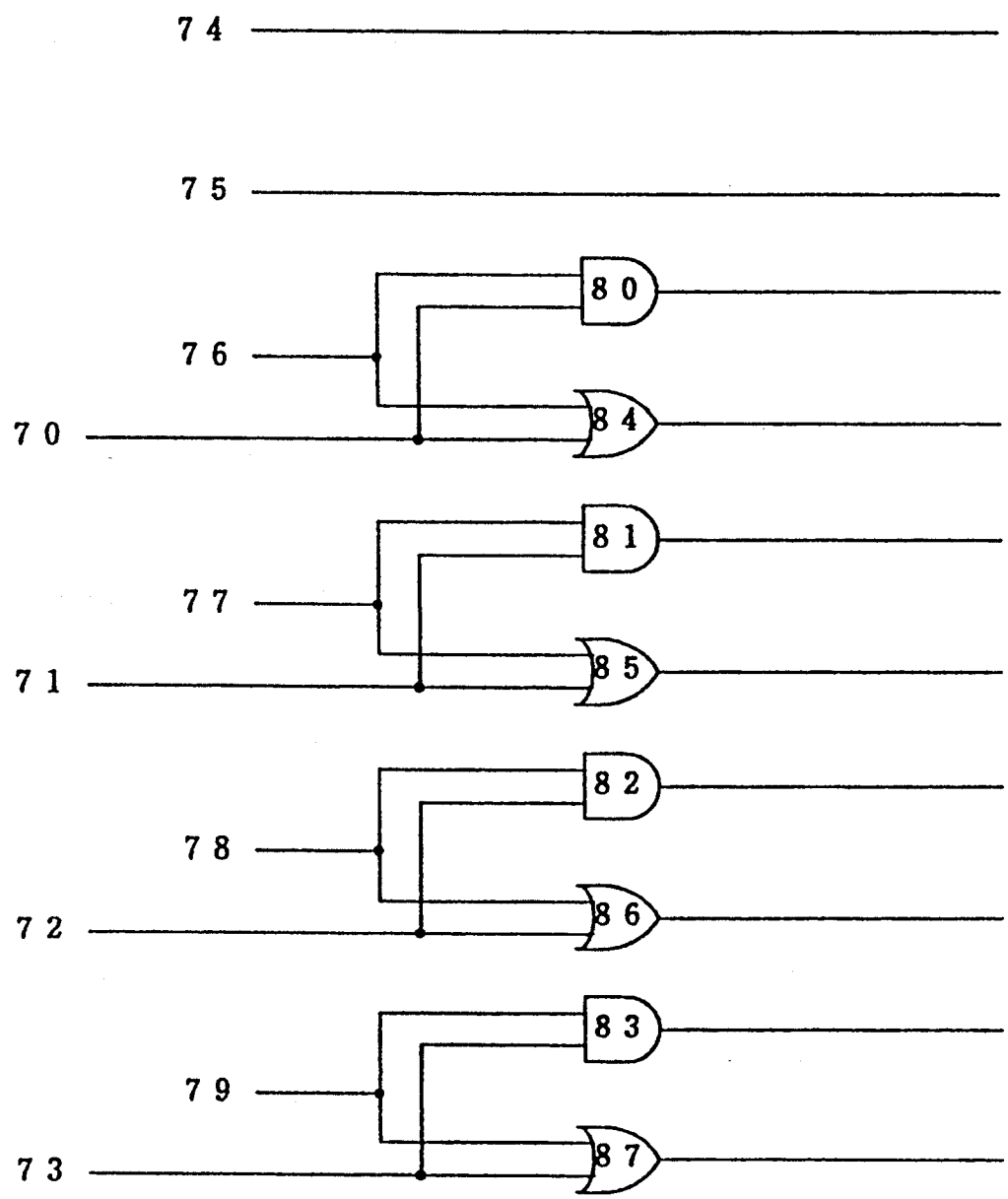
FIG. 4 is a diagram showing the configuration of simplified adding means in an add-compare-select device in a second embodiment according to the present invention.

FIG. 4 is a diagram showing the internal configuration of simplified adding means in an add-compare-select device in a second embodiment according to the present invention. The configuration other than that of the simplified adding means is identical to that shown in FIGS. 1 and 2 illustrating the first embodiment, and therefore, the same drawing and explanation will not be repeated here.

In FIG. 4, the numerals 70 to 73 indicate the first bit (the most significant bit), the second bit, the third bit, and the fourth bit (the least significant bit), respectively, of the branch metric, and the numerals 74 to 79 denotes the first bit (the most significant bit), the second bit, the third bit, the fourth bit, the fifth bit, and the sixth bit (the least significant bit), respectively, of the path metric.

The numerals 80 to 83 designate AND means which output the AND of the bits 70 and 76, the AND of the bits 71 and 77, the AND of the bits 72 and 78, and the AND of the bits 73 and 79, respectively. The numerals 84 to 87 indicate OR means which output the OR of the bits 70 and 76, the OR of the bits 71 and 77, the OR of the bits 72 and 78, and the OR of the bits 73 and 79, respectively.

The simplified path metric output from the illustrated simplified adding means is a digital signal consisting of the bit 74, the bit 75, the output of the AND means 80, the output of the OR means 84, the output of the AND means 81, the output of the OR means 85, the output of the AND means 82, the output of the OR means 86, the output of the AND means 83, and the output of the OR means 87, in this order counting from the most significant bit.

Next, the operation of the add-compare-select device of the second embodiment will be described below.

First, the adding means 36 to 43 add the branch metrics 0 to 7 and the path metrics 8 to 11 in respective combinations, and obtain the new path metric candidates 12 to 19.

Concurrently with the above operation, the simplified adding means 44 to 51 perform simple signal processing, i.e. the ANDing and ORing of the branch metrics 0 to 7 and path metrics 8 to 11, to obtain the simplified path metrics 20 to 27.

Next, the comparing means 52 to 55 compare the simplified path metrics 20 to 27 and output the selection information 28 to 31.

Thereafter, based on the selection information 28 to 31, the selecting means 56 to 59 each select one candidate from among the new path metric candidates 12 to 19, and the selected candidates are output as the new path metrics 32 to 35. As in the foregoing first embodiment, it is possible to select the new path metrics 32 to 35 by using the selection information 28 to 31 obtained from the simplified path metrics 20 to 27.

The memories 60 to 63 stores the new path metrics 32 to 35 which are output as the path metrics at the next point in time.

To generalize the above, from the branch metric $[a_m, a_{m-1}, \ldots, a_1, a_0]$ ($a_m$ is the most significant bit) and the path metric $[b_m, b_{m-1}, \ldots, b_1, b_0]$ ($b_m$ is the most significant bit) there are obtained digital data signals $[c_m, c_{m-1}, \ldots, c_1, c_0] = [a_m \cap b_m, a_{m-1} \cap b_{m-1}, \ldots, a_1 \cap b_1, a_0 \cap b_0]$ ($c_m$ is the most significant bit) and $[d_m, d_{m-1}, \ldots, d_1, d_0] = [a_m \cup b_m, a_{m-1} \cup b_{m-1}, \ldots, a_1 \cup b_1, a_0 \cup b_0]$ ($d_m$ is the most significant bit), or designated high order bits of the respective signals, and $[c_m, d_m, c_{m-1}, d_{m-1}, \ldots, c_1, d_1, c_0, d_0]$ ($c_m$ is the most significant bit), or designated high order bits thereof, is taken as the simplified path metrics (m is a positive integer, $a_0$–$a_m$, $b_0$–$b_m$, $c_0$–$c_m$, and $d_0$–$d_m$ are either 1 or 0, $\cap$ denotes the AND operation, and ∪ the OR operation). Here, both metrics are described as consisting of an equal number of bits, but actually, the branch metric has a fewer number of bits than the path metric. For generalization, the number of bits is made equal between the two metrics by adding 0s to fill up the blanks in the branch metric.

Thus, in the add-compare-select device of the second embodiment, the addition operations to obtain the path metrics and the simplified addition and comparison operations are performed concurrently, with the simplified additions being accomplished by simple signal processing involving the AND and OR operations. This serves to eliminate the carry propagation and reduce the signal processing time.

(3rd Embodiment)

Figure 5:
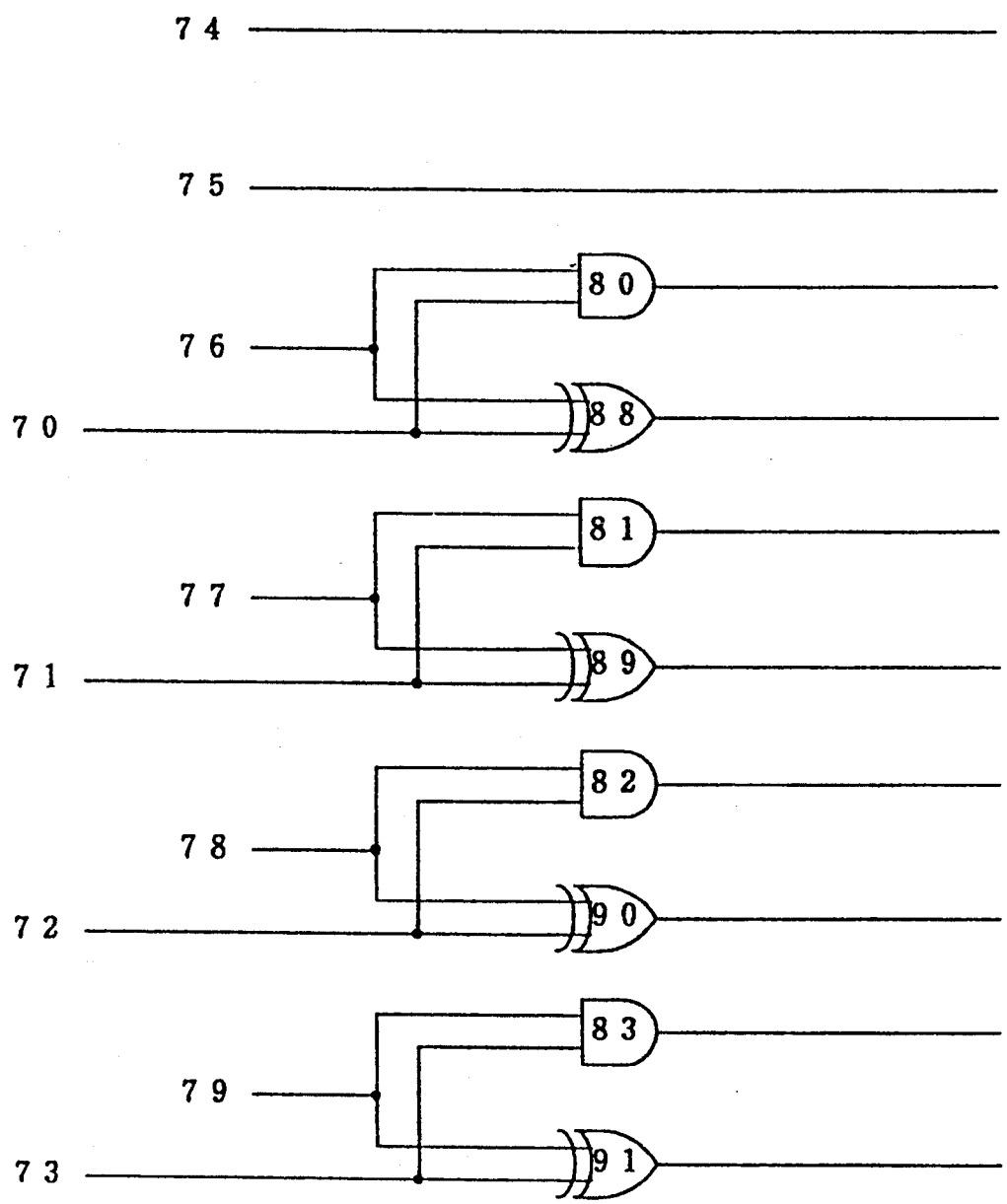
FIG. 5 is a diagram showing the configuration of simplified adding means in an add-compare-select device in a third embodiment according to the present invention.

FIG. 5 is a diagram showing the internal configuration of simplified adding means in an add-compare-select device in a third embodiment according to the present invention. The same parts as those of the simplified adding means shown in FIG. 4 are designated by the same reference numerals, and detailed explanation of such parts is omitted here. Also, the configuration other than that of the simplified adding means is identical to that shown in FIGS. 1 and 2, and therefore, the same drawing and explanation will not be repeated here.

In FIG. 5, the numerals 88 to 91 designate exclusive-OR means which output the EXOR of the bits 70 and 76, the EXOR of the bits 71 and 77, the EXOR of the bits 72 and 78, and the EXOR of the bits 73 and 79, respectively.

The simplified path metric output from the illustrated simplified adding means is a digital signal consisting of the bit 74, the bit 75, the output of the AND means 80, the output of the exclusive-OR means 88, the output of the AND means 81, the output of the exclusive-OR means 89, the output of the AND means 82, the output of the exclusive-OR means 90, the output of the AND means 83, and the output of the exclusive-OR means 91, in this order counting from the most significant bit.

Next, the operation of the add-compare-select device of the third embodiment will be described below.

First, the adding means 36 to 43 add the branch metrics 0 to 7 and path metrics 8 to 11 in respectively combinations, and obtain the new path metric candidates 12 to 19.

Concurrently with the above operation, the simplified adding means 44 to 51 perform simple signal processing, i.e. the ANDing and EXORing of the branch metrics 0 to 7 and path metrics 8 to 11, to obtain the simplified path metrics 20 to 27.

Next, the comparing means 52 to 55 compare the simplified path metrics 20 to 27 and output the selection information 28 to 31.

Thereafter, based on the selection information 28 to 31, the selecting means 56 to 59 each select one candidate from among the new path metric candidates 12 to 19, and the selected candidates are output as the new path metrics 32 to 35. As in the foregoing second embodiment, it is possible to select the new path metrics 32 to 35 by using the selection information 28 to 31 obtained from the simplified path metrics 20 to 27.

The memories 60 to 63 stores the new path metrics 32 to 35 which are output as the path metrics at the next point in time.

To generalize the above, from the branch metric $[a_m, a_{m-1}, \ldots, a_1, a_0]$ ($a_m$ is the most significant bit) and the path metric $[b_m, b_{m-1}, \ldots, b_1, b_0]$ ($b_m$ is the most significant bit) there are obtained digital data signals $[c_m, c_{m-1}, \ldots, c_1, c_0] = [a_m \cap b_m, a_{m-1} \cap b_{m-1}, \ldots, a_1 \cap b_1, a_0 \cap b_0]$ ($c_m$ is the most significant bit) and $[d_m, d_{m-1}, \ldots, d_1, d_0] = [a_m + b_m, a_{m-1} + b_{m-1}, \ldots, a_1 + b_1, a_0 + b_0]$ ($d_m$ is the most significant bit), or designated high order bits of the respective signals, and $[c_m, d_m, c_{m-1}, d_{m-1}, \ldots]$ designated high order bits thereof, is taken as the simplified path metrics (m is a positive integer, $a_0$-$a_m$, $b_0$-$b_m$, $c_0$-$c_m$, and $d_0$-$d_m$ are either 1 or 0, $\cap$ denotes the AND operation, and $+$ the EXOR operation). Here, the number of bits is made equal between both metrics for the same reason as given in the second embodiment.

Thus, in the add-compare-select device of the third embodiment, the addition operations to obtain the path metrics and the simplified addition and comparison operations are performed concurrently, with the simplified additions being accomplished by simple signal processing involving the AND and EXOR operations. This serves to eliminate the carry propagation and reduce the signal processing time.

(4th Embodiment)

Figure 6:
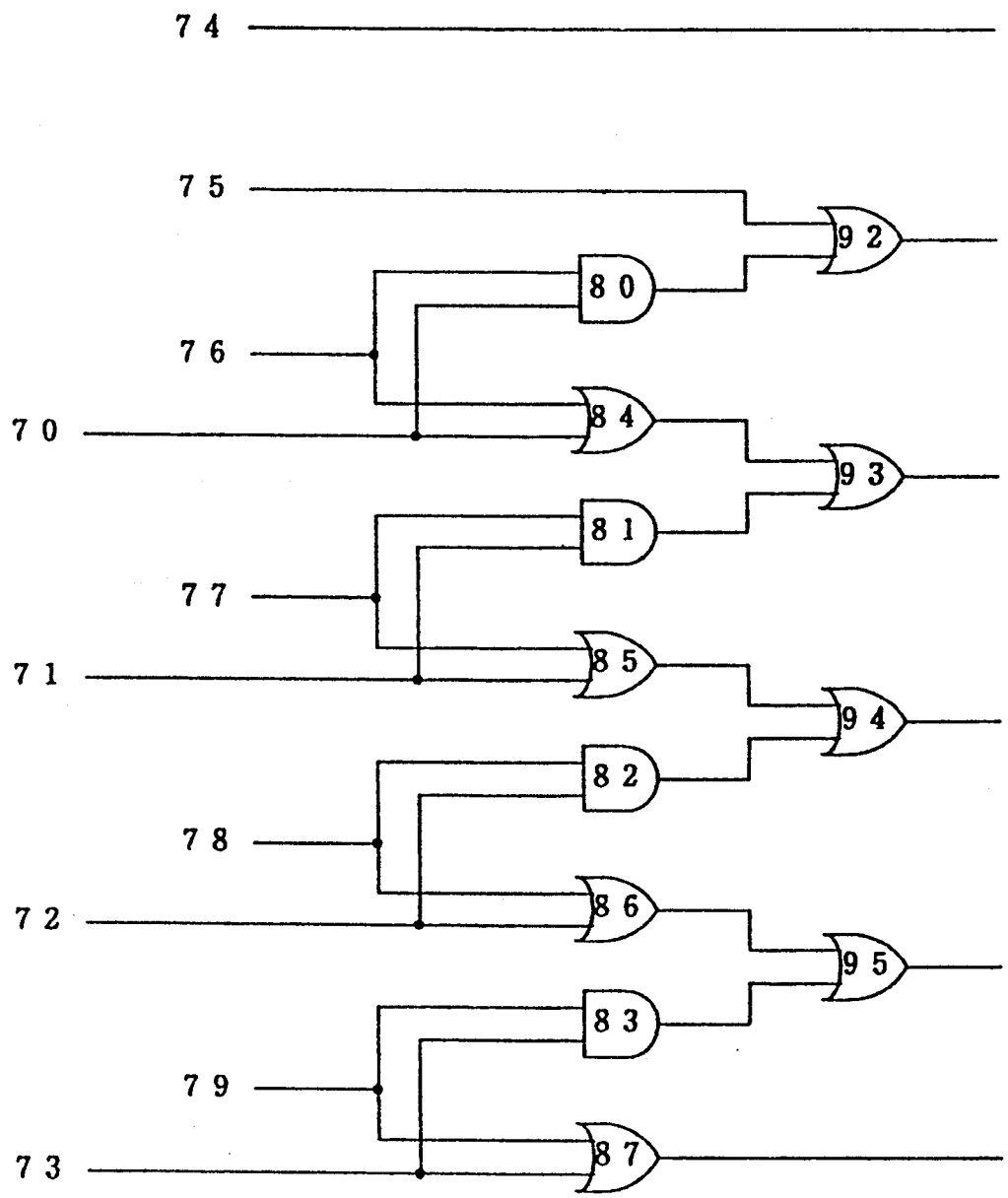
FIG. 6 is a diagram showing the configuration of simplified adding means in an add-compare-select device in a fourth embodiment according to the present invention.

FIG. 6 is a diagram showing the internal configuration of simplified adding means in an add-compare-select device in a fourth embodiment according to the present invention. The same parts as those of the simplified adding means shown in FIG. 4 are designated by the same reference numerals, and detailed explanation of such parts is omitted here. Also, the configuration other than that of the simplified adding means is identical to that shown in FIGS. 1 and 2, and therefore, the same drawing and explanation will not be repeated here.

In FIG. 6, the numerals 92 to 95 designate OR means which output the OR between the bit 75 and the output of the AND means 80, the OR between the output of the OR means 84 and the output of the AND means 81, the OR between the OR means 85 and the AND means 82, and the OR between the output of the OR means 86 and the output of the AND means 83, respectively.

The simplified path metric output from the illustrated simplified adding means is a digital signal consisting of the bit 74, the output of the OR means 92, the output of the OR means 93, the output of the OR means 94, the output of the OR means 95, and the output of the OR means 87, in this order counting from the most significant bit.

Next, the operation of the add-compare-select device of the fourth embodiment will be described below.

First, the adding means 36 to 43 add the branch metrics 0 to 7 and path metrics 8 to 11 in respective combinations, and obtain the new path metric candidates 12 to 19.

On the other hand, the simplified adding means 44 to 51 perform simple signal processing, i.e. the ANDing and ORing of the branch metrics 0 to 7 and path metrics 8 to 11, to obtain the simplified path metrics 20 to 27.

Next, the comparing means 52 to 55 compare the simplified path metrics 20 to 27 and output the selection information 28 to 31.

Thereafter, based on the selection information 28 to 31, the selecting means 56 to 59 each select one candidate from among the new path metric candidates 12 to 19, and the selected candidates are output as the new path metrics 32 to 35. As in the foregoing third embodiment, it is possible to select the new path metrics 32 to 35 by using the selection information 28 to 31 obtained from the simplified path metrics 20 to 27.

The memories 60 to 63 store the new path metrics 32 to 35 which are output as the path metrics at the next point in time.

To generalize the above, from the branch metric $[a_m, a_{m-1}, \ldots, a_1, a_0]$ ($a_m$ is the most significant bit) and the path metric $[b_m, b_{m-1}, \ldots, b_1, b_0]$ ($b_m$ is the most significant bit) there are obtained digital data signals $[c_m, c_{m-1}, \ldots, c_1, c_0] = [a_m \cap b_m, a_{m-1} \cap b_{m-1}, \ldots, a_1 \cap b_1, a_0 \cap b_0]$ ($c_m$ is the most significant bit) and $[d_m, d_{m-1}, \ldots, d_1, d_0] = [a_m \cup b_m, a_{m-1} \cup b_{m-1}, \ldots, a_1 \cup b_1, a_0 \cup b_0]$ ($d_m$ is the most significant bit), or designated high order bits of the respective signals, and $[c_m, d_m \cup c_{m-}, d_{m-1} \cup c_{m-2}, \ldots, d_2 \cup c_1, d_1 \cup c_0, d_0]$ ($c_m$ is the most significant bit), or designated high order bits thereof, is taken as the simplified path metrics (m is a positive integer, $a_0$–$a_m$, $b_0$–$b_m$, $c_0$–$c_m$, and $d_0$–$d_m$ are either 1 or 0, $\cap$ denotes the AND operation, and $\cup$ the OR operation). Here, the number of bits is made equal between the branch metric and the path metric for the same reason as given in the second embodiment.

Thus, in the add-compare-select device of the fourth embodiment, the addition operations to obtain the path metrics and the simplified addition and comparison operations are performed concurrently, with the simplified additions being accomplished by simple signal processing involving the AND and OR operations. This serves to reduce the time required for carry propagation and accomplishes a reduction in the signal processing time.

(5th Embodiment)

Figure 7:
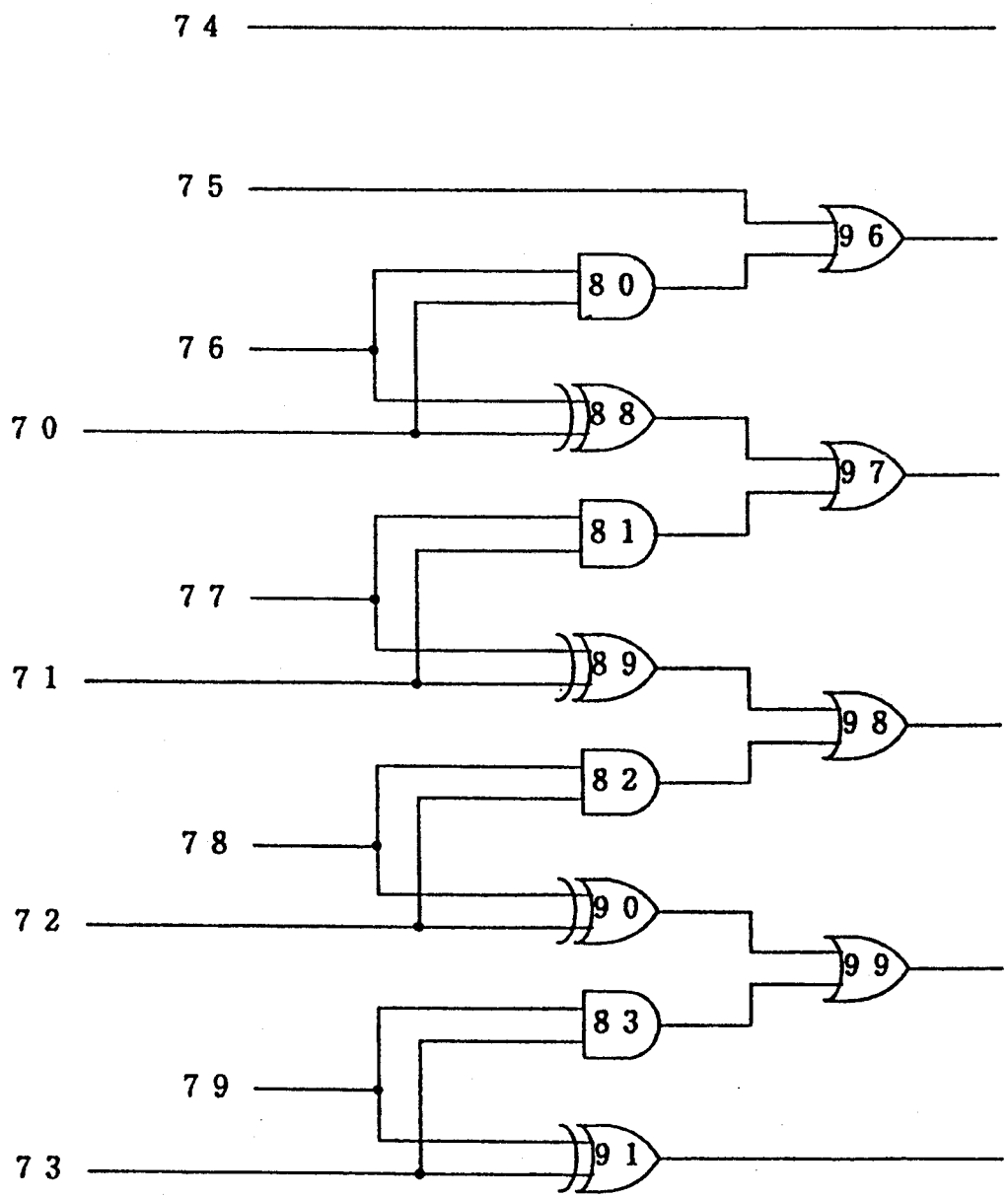
FIG. 7 is a diagram showing the configuration of simplified adding means in an add-compare-select device in a fifth embodiment according to the present invention.

FIG. 7 is a diagram showing the internal configuration of simplified adding means in an add-compare-select device in a fifth embodiment according to the present invention. The same parts as those of the simplified adding means shown in FIG. 5 are designated by the same reference numerals, and detailed explanation of such parts is omitted here. Also, the configuration other than that of the simplified adding means is identical to that shown in FIGS. 1 and 2, and therefore, the same drawing and explanation will not be repeated here.

In FIG. 7, the numerals 96 to 99 designate OR means which output the OR between the bit 75 and the output of the AND means 80, the OR between the output of the exclusive-OR means 88 and the output of the AND means 81, the OR between the output of the exclusive-OR means 89 and the AND means 82, and the OR between the output of the exclusive-OR means 90 and the output of the AND means 83, respectively.

The simplified path metric Output from the illustrated simplified adding means is a digital signal consisting of the bit 74, the output of the OR means 96, the output of the OR means 97, the output of the OR means 98, the output of the OR means 99, and the output of the exclusive-OR means 91, in this order counting from the most significant bit.

Next, the operation of the add-compare-select device of the fifth embodiment will be described below.

First, the adding means 36 to 43 add the branch metrics 0 to 7 and path metrics 8 to 11 in respective combinations, and obtain the new path metric candidates 12 to 19.

On the other hand, the simplified adding means 44 to 51 perform simple signal processing, i.e. the ANDing, EXORing, and ORing of the branch metrics 0 to 7 and path metrics 8 to 11, to obtain the simplified path metrics 20 to 27.

Next, the comparing means 52 to 55 compare the simplified path metrics 20 to 27 and output the selection information 28 to 31.

Thereafter, based on the selection information 28 to 31, the selecting means 56 to 59 each select one candidate from among the new path metric candidates 12 to 19, and the selected candidates are output as the new path metrics 32 to 35. As in the foregoing fourth embodiment, it is possible to select the new path metrics 32 to 35 by using the selection information 28 to 31 obtained from the simplified path metrics 20 to 27.

The memories 60 to 63 store the new path metrics 32 to 35 which are output as the path metrics at the next point in time.

To generalize the above, from the branch metric $[a_m, a_{m-1}, \ldots, a_1, a_0]$ ($a_m$ is the most significant bit) and the path metric $[b_m, b_{m-1}, \ldots, b_1, b_0]$ ($b_m$ is the most significant bit) there are obtained digital data signals $[c_m, c_{m-1}, \ldots, c_1, c_0] = [a_m \cap b_m, a_{m-1} \cap b_{m-1}, \ldots, a_1 \cap b_1, a_0 \cap b_0]$ ($c_m$ is the most significant bit) and $[d_m, d_{m-1}, \ldots, d_1, d_0] = [a_m + b_m, a_{m-1} + b_{m-1}, \ldots, a_1 + b_1, a_0 + b_0]$ ($d_m$ is the most significant bit), or designated high order bits of the respective signals, and $[c_m, d_m \cup c_{m-1}, d_{m-1} \cup c_{m-2}, \ldots, d_2 \cup c_1, d_1 \cup c_0, d_0]$ ($c_m$ is the most significant bit), or designated high order bits thereof, is taken as the simplified path metrics (m is a positive integer, $a_0$–$a_m$, $b_0$–$b_m$, $c_0$–$c_m$, and $d_0$–$d_m$ are either 1 or 0, $\cap$ denotes the AND operation, $\cup$ the OR operation, and $+$ the EXOR operation). Here, the number of bits is made equal between the branch metric and the path metric for the same reason as given in the second embodiment.

Thus, in the add-compare-select device of the fifth embodiment, the addition operations to obtain the path metrics and the simplified addition and comparison operations are performed concurrently, with the simplified additions being accomplished by Simple signal processing involving the AND, EXOR, and OR operations. This serves to reduce the time required for carry propagation and accomplishes a reduction in the signal processing time.

(6th Embodiment)

Figure 8:
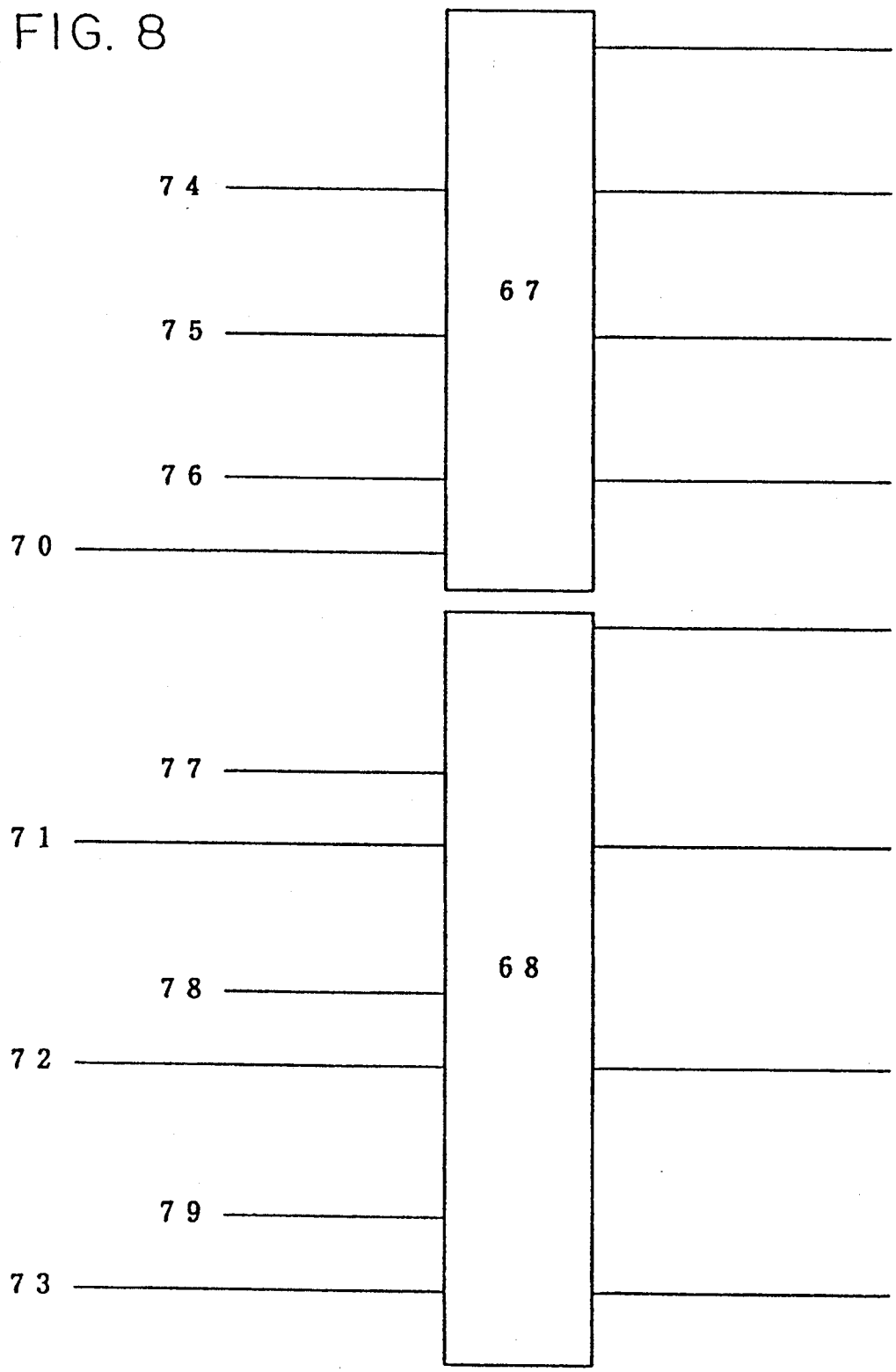
FIG. 8 is a diagram showing the configuration of simplified adding means in an add-compare-select device in a sixth embodiment according to the present invention.

FIG. 8 is a diagram showing the internal configuration of simplified adding means in an add-compare-select device in a sixth embodiment according to the present invention. The same data signal parts as those shown in FIG. 4 are designated by the same reference numerals, and detailed explanation of such parts is omitted here. Also, the configuration other than that of the simplified adding means is identical to that shown in FIGS. 1 and 2, and therefore, the same drawing and explanation will not be repeated here.

In FIG. 8, the numeral 67 designates adding means for adding a digital signal consisting of the high order three bits (bits 74, 75, and 76) of the path metric to a digital signal consisting of the most significant bit (bit 70) of the branch metric, and for outputting the result as a four-bit digital signal; and the numeral 68 indicates adding means for adding a digital signal consisting of the low order three bits (bits 77, 78, and 79) of the path metric to a digital signal consisting of the low order three bits (bits 71, 72, and 73) of the branch metric, and for outputting the result as a four-bit digital signal.

The simplified path metric output from the illustrated simplified adding means is a digital signal consisting of the first bit of the output of the adding means 67, the second bit of the same, the third bit of the same, the fourth bit of the same, the first bit of the output of the adding means 68, the second bit of the same, the third bit of the same, and the fourth bit of the same, in this order counting from the most significant bit.

Next, the operation of the add-compare-select device of the sixth embodiment will be described below.

First, the adding means 36 to 43 add the branch metrics 0 to 7 and path metrics 8 to 11 in respective combinations, and obtain the new path metric candidates 12 to 19.

On the other hand, the simplified adding means 44 to 51 divide the branch metrics 0 to 7 and path metrics 8 to 11 into two groups, one consisting of high order bits and the other consisting of low order bits, and perform additions within the respective groups, to obtain the simplified path metrics 20 to 27.

Next, the comparing means 52 to 55 compare the simplified path metrics 20 to 27 and output the selection information 28 to 31.

Thereafter, based on the selection information 28 to 31, the selecting means 56 to 59 each select one candidate from among the new path metric candidates 12 to 19, and the selected candidates are output as the new path metrics 32 to 35. As in the foregoing fifth embodiment, it is possible to select the new path metrics 32 to 35 by using the selection information 28 to 31 obtained from the simplified path metrics 20 to 27.

The memories 60 to 63 store the new path metrics 32 to 35 which are output as the path metrics at the next point in time.

To generalize the above, the branch metric [$a_m$, $a_{m-1}$], and the path metric [$b_m$, $b_{m-1}$, ..., $b_k$, $b_{k-1}$, ..., $b_1$, $b_0$] ($b_m$ is the most significant bit) are each divided into high order $m-k+1$ bits and low order k bits; then, addition of the high order bits only and addition of all the low order bits or part of the high order bits are carried out, to obtain a digital data signal [$e_{m+1}$, $e_m$, $e_{m-1}$, ..., $e_{k+1}$, $e_k$] ($e_{m+1}$ is the most significant bit) representing the result of the addition of the high order bits and a digital signal [$f_{k+1}$, $f_k$, $f_{k-1}$, ..., $f_{j+1}$, $f_j$] ($f_{k+1}$ is the most significant bit) representing the result of the addition of all the low order bits or part of the high order bits, and [$e_{m+1}$, $e_m$, $e_{m-1}$, most significant bit), or designated high order bits thereof, is taken as the simplified path metric (m, k are positive integers, j is an integer larger than 0, $m>k>j$, and $a_0-a_m$, $b_0-b_m$, $e_0-e_{m+1}$, are $f_j-f_{k+1}$ are either 1 or 0). Here, the number of bits is made equal between the branch metric and the path metric for the same reason as given in the second embodiment.

Thus, in the add-compare-select device of the sixth embodiment, the addition operations to obtain the path metrics and the simplified addition and comparison operations are performed concurrently, with the simplified additions being carried out on two groups, one with the high order bits and the other with the low order bits. This serves to reduce the time required for carry propagation and accomplishes a reduction in the signal processing time.

(7th Embodiment)

Figure 9:
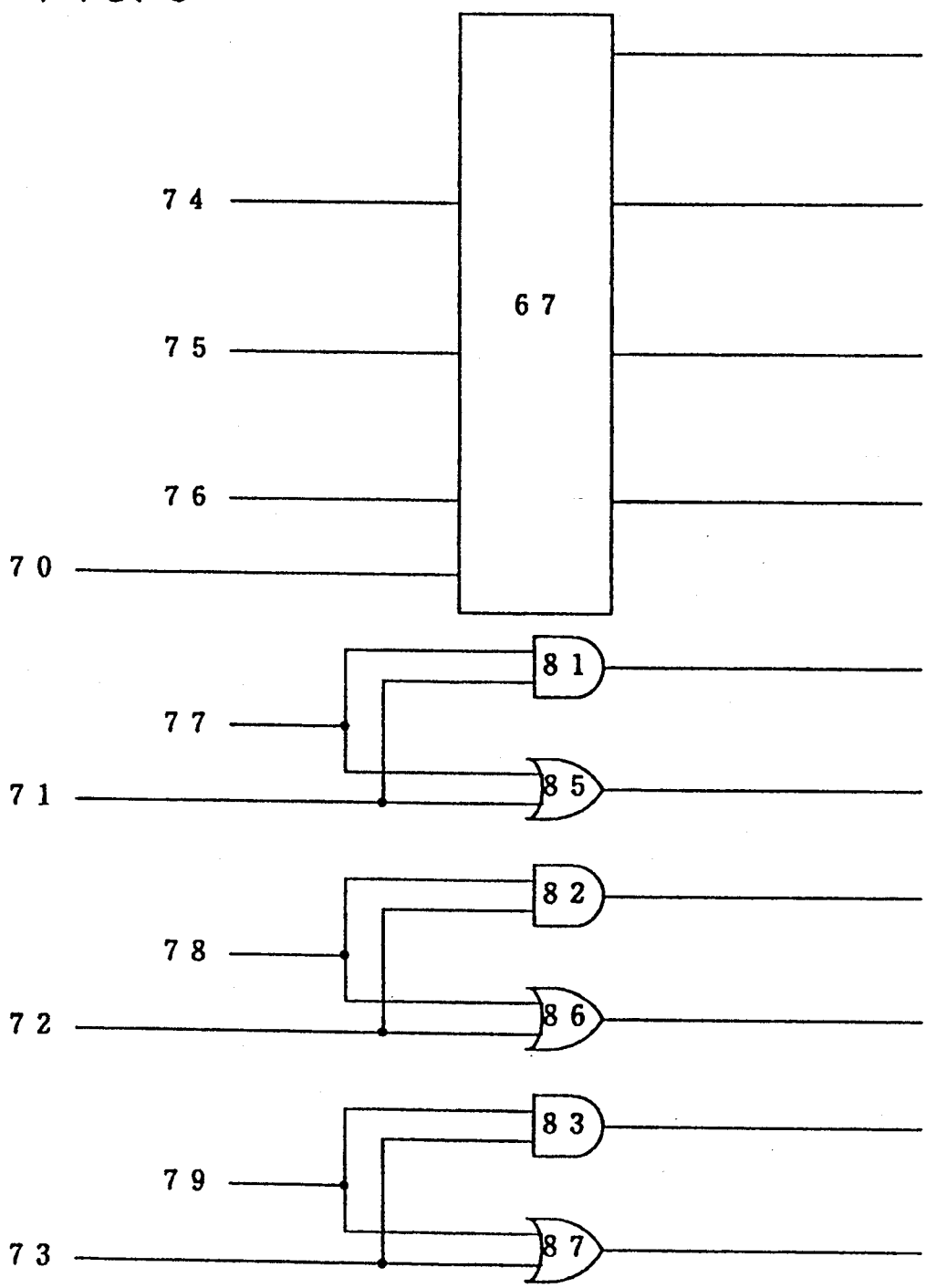
FIG. 9 is a diagram showing the configuration of simplified adding means in an add-compare-select device in a seventh embodiment according to the present invention.

FIG. 9 is a diagram showing the internal configuration of simplified adding means in an add-compare-select device in a seventh embodiment according to the present invention. The same parts as those of the simplified adding means shown in FIGS. 4 and 8 are designated by the same reference numerals, and detailed explanation of such parts is omitted here. Also, the configuration other than that of the simplified adding means is identical to that shown in FIGS. 1 and 2, and therefore, the same drawing and explanation will not be repeated here.

The simplified path metric output from the illustrated simplified adding means is a digital signal consisting of the first bit of the output of the adding means 67, the second bit of the same, the third bit of the same, the fourth bit of the same, the output of the AND means 81, the output of the OR means 85, the output of the AND means 82, the output of the OR means 86, the output of the AND means 83, and the output of the OR means 87, in this order counting from the most significant bit.

Next, the operation of the add-compare-select device of the seventh embodiment will be described below.

First, the adding means 36 to 43 add the branch metrics 0 to 7 and path metrics 8 to 11 in respective combinations, and obtain the new path metric candidates 12 to 19.

On the other hand, the simplified adding means 44 to 51 divide the branch metrics 0 to 7 and path metrics 8 to 11 into two groups, one consisting of high order bits and the other consisting of low order bits, and perform a usual addition operation on the high order bits and simple signal processing, i.e. AND and OR operations, on the low order bits, to obtain the simplified path metrics 20 to 27.

Next, the comparing means 52 to 55 compare the simplified path metrics 20 to 27 and output the selection information 28 to 31.

Thereafter, based on the selection information 28 to 31, the selecting means 56 to 59 each select one candidate from among the new path metric candidates 12 to 19, and the selected candidates are output as the new path metrics 32 to 35. As in the foregoing sixth embodiment, it is possible to select the new path metrics 32 to 35 by using the selection information 28 to 31 obtained from the simplified path metrics 20 to 27.

The memories 60 to 63 store the new path metrics 32 to 35 which are output as the path metrics at the next point in time.

To generalize the above, the branch metric [$a_m$, $a_{m-1}$], and the path metric [$b_m$, $b_{m-1}$, ..., $b_k$, $b_{k-1}$, ..., $b_1$, $b_0$] ($b_m$ is the most significant bit) are each divided into high order $m-k+1$ bits and low order k bits; then, a digital data signal [$e_{m+1}$, $e_m$, $e_{m-1}$, ..., $e_{k+1}$, $e_k$] ($e_{m+1}$ is the most significant bit) is obtained by adding the high order bits only, and from all the low order bits or part of the high order bits, digital signals [$c_k$, $c_{k-1}$, ..., $c_1$, $c_0$] = [$a_k \cap b_k$, $a_{k-1} \cap b_{k-1}$, ..., $a_1 \cap b_1$, $a_0 \cap b_0$] ($c_k$ is the most significant bit) and [$d_k$, $d_{k-1}$, ..., $d_1$, $d_0$] = [$a_k \cup b_k$, $a_{k-1} \cup b_{k-1}$, ..., $a_1 \cup b_1$, $a_0 \cup b_0$] ($d_k$ is the most significant bit), or designated high order bits of the respective signals, are obtained; and [$e_{m+1}$, $e_m$, $e_{m-1}$, ..., $e_{k+1}$, $e_k$, $c_k$, $d_k$, $c_{k-1}$, $d_{k-1}$, ..., $c_1$, $d_1$, $c_0$, $d_0$] ($e_{m+1}$ is the most significant bit), or designated high order bits thereof, is taken as the simplified path metric (m, k are positive integers, j is an integer larger than 0, $m>k>j$, $a_0-a_m$, $b_0-b_m$, $c_0-c_k$, $d_0-d_k$, and $e_k-e_{m+1}$ are either 1 or 0, $\cup$ denotes the AND operation, and $\cup$ the OR operation). Here, the number of bits is made equal between the branch metric and path metric for the same reason as given in the second embodiment.

Thus, in the add-compare-select device of the seventh embodiment, the addition operations to obtain the path metrics and the simplified addition and comparison operations are performed concurrently, with the simplified additions being carried out on two groups, one with the high order bits and the other with the low order bits, a usual addition operation being performed on the high order bits and simple signal processing involving AND and OR operations being performed on the low order bits. This serves to reduce the time required for carry propagation and accomplishes a reduction in the signal processing time.

(8th Embodiment)

Figure 10:
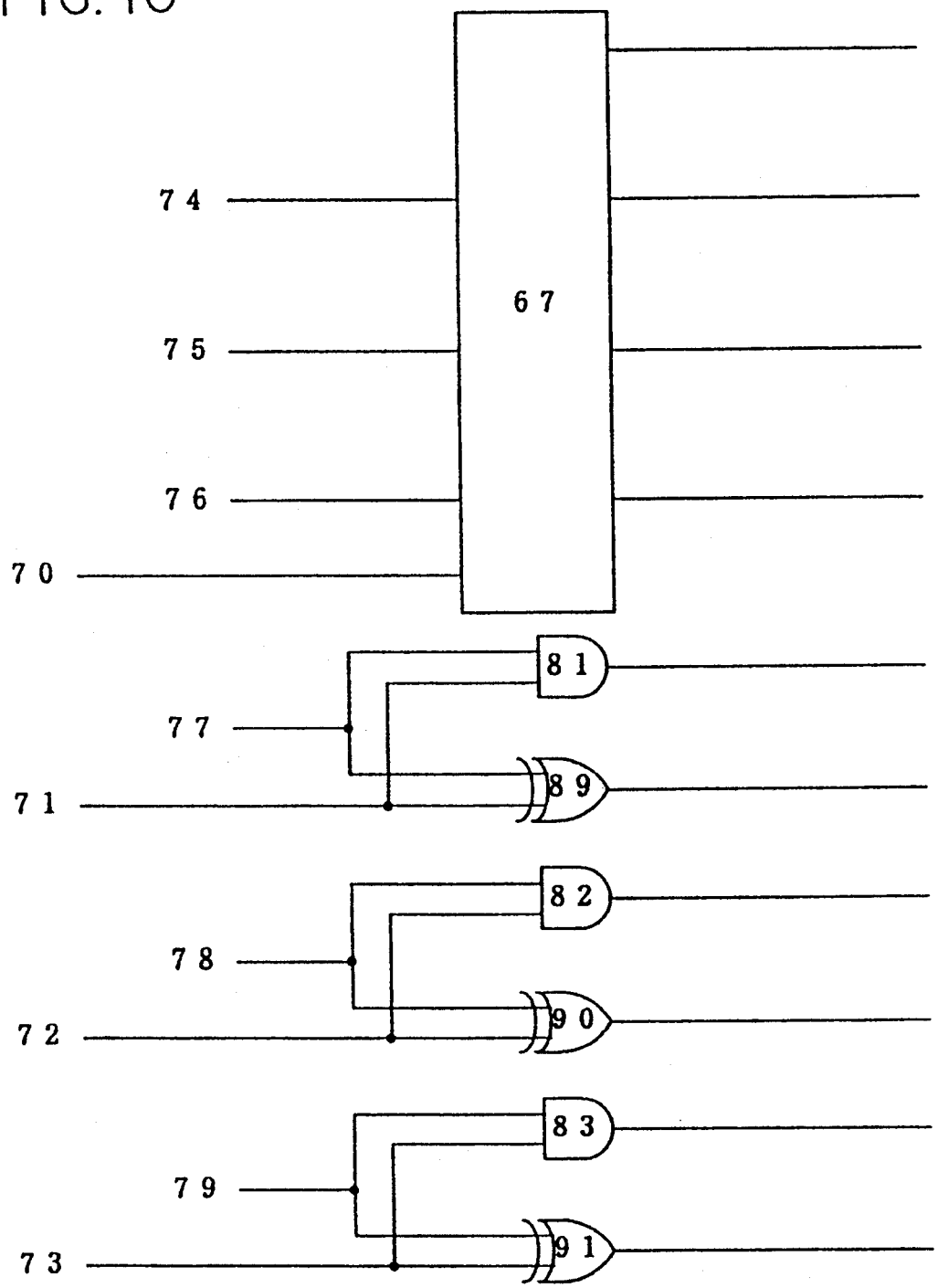
FIG. 10 is a diagram showing the configuration of simplified adding means in an add-compare-select device in an eighth embodiment according to the present invention.

FIG. 10 is a diagram showing the internal configuration of simplified adding means in an add-compare-select device in an eighth embodiment according to the present invention. The same parts as those of the simplified adding means shown in FIGS. 5 and 8 are designated by the same reference numerals, and detailed explanation of such parts is omitted here. Also, the configuration other than that of the simplified adding means is identical to that shown in FIGS. 1 and 2, and therefore, the same drawing and explanation will not be repeated here.

The simplified path metric output from the illustrated simplified adding means is a digital signal consisting of the first bit of the output of the adding means 67, the second bit of the same, the third bit of the same, the fourth bit of the same, the output of the AND means 81, the output of the exclusive-OR means 89, the output of the AND means 82, the output of the exclusive-OR means 90, the output of the AND means 83, and the output of the exclusive-OR means 91, in this order counting from the most significant bit.

Next, the operation of the add-compare-select device of the eighth embodiment will be described below.

First, the adding means 36 to 43 add the branch metrics 0 to 7 and path metrics 8 to 11 in respective combinations, and obtain the new path metric candidates 12 to 19.

On the other hand, the simplified adding means 44 to 51 divide the branch metrics 0 to 7 and path metrics 8 to 11 into two groups, one consisting of high order bits and the other consisting of low order bits, and perform a usual addition operation on the high order bits and simple signal processing, i.e. AND and EXOR operations, on the low order bits, to obtain the simplified path metrics 20 to 27.

Next, the comparing means 52 to 55 compare the simplified path metrics 20 to 27 and output the selection information 28 to 31.

Thereafter, based on the selection information 28 to 31, the selecting means 56 to 59 each select one candidate from among the new path metric candidates 12 to 19, and the selected candidates are output as the new path metrics 32 to 35. As in the foregoing seventh embodiment, it is possible to select the new path metrics 32 to 35 by using the selection information 28 to 31 obtained from the simplified path metrics 20 to 27.

The memories 60 to 63 store the new path metrics 32 to 35 which are output as the path metrics at the next point in time.

To generalize the above, the branch metric $[a_m, a_{m-1}, \ldots, a_1, b_0]$ and the path metric $[b_m, b_{m-1}, \ldots, b_k, b_{k-1}, \ldots, b_1, b_0]$ ($b_m$ is the most significant bit) are each divided into high order $m-k+1$ bits and low order k bits; then, a digital data signal $[e_{m+1}, e_m, e_{m-1}, \ldots, e_{k+1}, e_k]$ ($e_{m+1}$ is the most significant bit) is obtained by adding the high order bits only, and from all the low order bits or part of the high order bits, digital signals $[c_k, c_{k-1}, \ldots, c_1, c_0] = [a_k \cap b_k, a_{k-1} \cap b_{k-1}, \ldots, a_1 \cap b_1, a_0 \cap b_0]$ ($c_k$ is the most significant bit) and $[d_k, d_{k-1}, \ldots, d_1, d_0] = [a_k + b_k, a_{k-1} + b_{k-1}, \ldots, a_1 + b_1, a_0 + b_0]$ ($d_k$ is the most significant bit), or designated high order bits of the respective signals, are obtained; and $[e_{m+1}, e_m, e_{m-1}, \ldots, e_{k+1}, e_k, c_k, d_k, c_{k-1}, d_{k-1}, \ldots, c_1, d_1, c_0, d_0]$ ($e_{m+1}$ is the most significant bit), or designated high order bits thereof, is taken as the simplified path metric (m, k are positive integers, j is an integer larger than 0, $m > k > j$, $a_0$–$a_m$, $b_0$–$b_m$, $c_0$–$c_k$, $d_0$–$d_k$, $d_0$–$d_k$, and $e_0$–$e_{m+1}$ are either 1 or 0, $\cap$ denotes the AND operation, and $+$ the EXOR operation). Here, the number of bits is made equal between the branch metric and the path metric for the same reason as given in the second embodiment.

Thus, in the add-compare-select device of the eighth embodiment, the addition operations to obtain the path metrics and the simplified addition and comparison operations are performed concurrently, with the simplified additions being carried out on two groups, one with the high order bits and the other with the low order bits, a usual addition operation being performed on the high order bits and simple signal processing involving AND and EXOR operations being performed on the low order bits. This serves to reduce the time required for carry propagation and accomplishes a reduction in the signal processing time.

(9th Embodiment)

Figure 11:
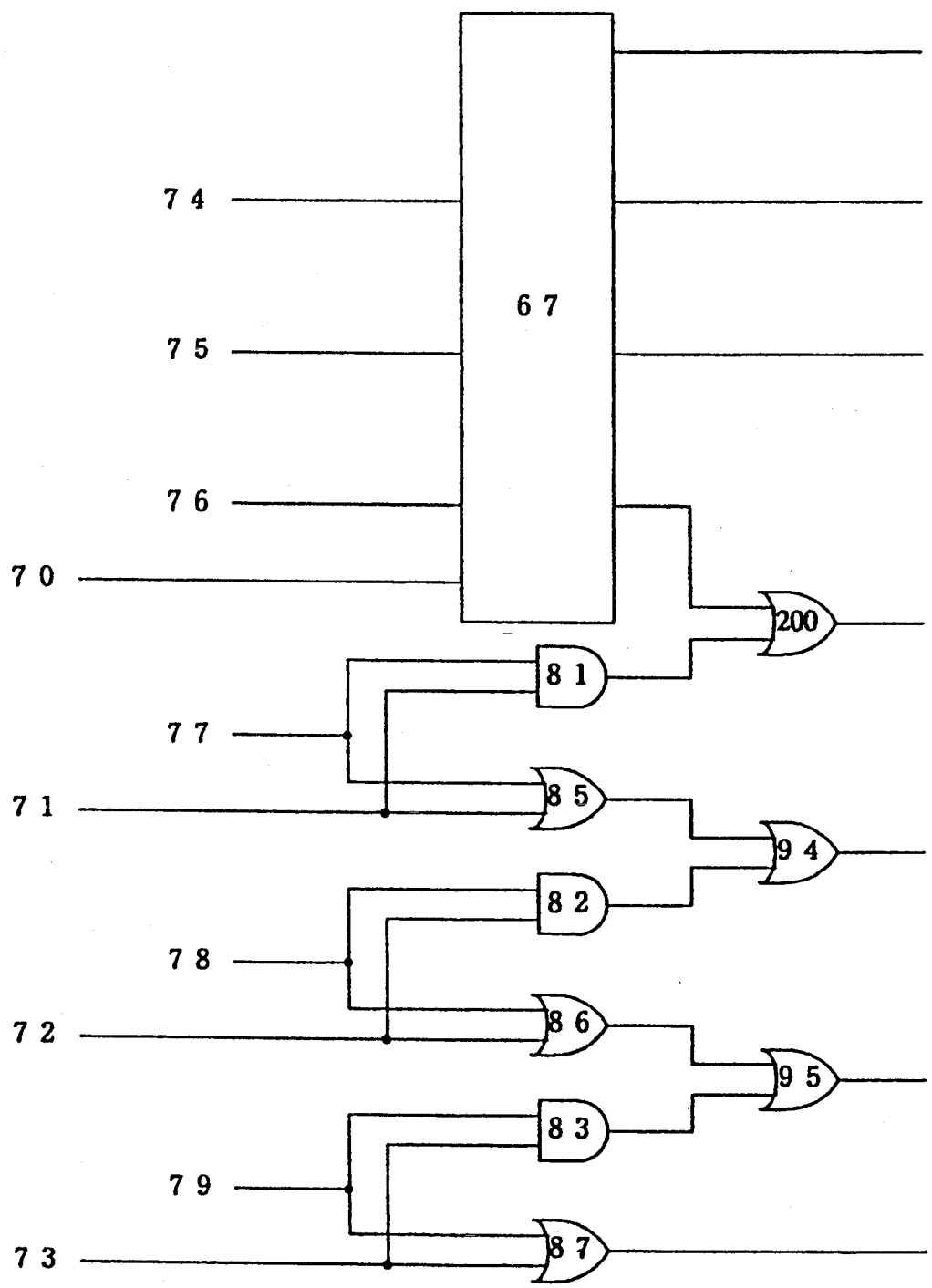
FIG. 11 is a diagram showing the configuration of simplified adding means in an add-compare-select device in a ninth embodiment according to the present invention.

FIG. 11 is a diagram showing the internal configuration of simplified adding means in an add-compare-select device in a ninth embodiment according to the present invention. The same parts as those of the simplified adding means shown in FIGS. 6 and 8 are designated by the same reference numerals, and detailed explanation of such parts is omitted here. Also, the configuration other than that of the simplified adding means is identical to that shown in FIGS. 1 and 2, and therefore, the same drawing and explanation will not be repeated here.

In FIG. 11, the numeral 20 indicates an OR means that outputs the OR between the fourth bit in the output of the adding means 67 and the output of the AND means 81.

The simplified path metric output from the illustrated simplified adding means is a digital signal consisting of the first bit of the output of the adding means 67, the second bit of the same, the third bit of the same, the output of the OR means 200, the output of the OR means 94, the output of OR means 95, and the output of the OR means 87, in this order counting from the most significant bit.

Next, the operation of the add-compare-select device of the ninth embodiment will be described below.

First, the adding means 36 to 43 add the branch metrics 0 to 7 and path metrics 8 to 11 in respective combinations, and obtain the new path metric candidates 12 to 19.

On the other hand, the simplified adding means 44 to 51 divide the branch metrics 0 to 7 and path metrics 8 to 11 into two groups, one consisting of high order bits and the other consisting of low order bits, and perform a usual addition operation on the high order bits and simple signal processing, i.e. AND and OR operations, on the low order bits, to obtain the simplified path metrics 20 to 27.

Next, the comparing means 52 to 55 compare the simplified path metrics 20 to 27 and output the selection information.

Thereafter, based on the selection information 28 to 31, the selecting means 56 to 59 each select one candidate from among the new path metric candidates 12 to 19, and the selected candidates are output as the new path metrics 32 to 35. As in the foregoing eighth embodiment, it is possible to select the new path metrics 32 to 35 by using the selection information 28 to 31 obtained from the simplified path metrics 20 to 27.

The memories 60 to 63 store the new path metrics 32 to 35 which are output as the path metrics at the next point in time.

To generalize the above, the branch metric [$a_m$, $a_{m-1}$, and the path metric [$b_m$, $b_{m-1}$, ..., $b_k$, $b_{k-1}$, ..., $b_1$, $b_0$] ($b_m$ is the most significant bit) are each divided into high order $m-k+1$ bits and low order k bits; then, a digital data signal [$e_{m+1}$, $e_m$, $e_{m-1}$, ..., $e_{k+1}$, $e_k$] ($e_{m+1}$ is the most significant bit) is obtained by adding the high order bits only, and from all the low order bits or part of the high order bits, digital signals [$c_k$, $c_{k-1}$, ..., $c_1$, $c_0$] = [$a_k \cap b_k$, $a_{k-1} \cap b_{k-1}$, ..., $a_1 \cap b_1$, $a_0 \cap b_0$] ($c_k$ is the most significant bit) and [$d_k$, $d_{k-1}$, ..., $d_1$, $d_0$] = [$a_k \cup b_{k-1} \cup b_{k-1}$, ..., $a_1 \cup b_1$, $a_0 \cup b_0$] ($d_k$ is the most significant bit), or designated high order bits of the respective signals, are obtained; and [$e_{m+1}$, $e_m$, $e_{m-1}$, ..., $e_{k+1}$, $e_k \cup c_k$, $d_k \cup c_{k-1}$, $d_{k-1} \cup c_{k-2}$, ..., $d_2 \cup c_1$, $d_1 \cup c_0$, $d_0$] ($e_{m+1}$ is the most significant bit), or designated high order bits thereof, is taken as the simplified path metric (m, k are positive integers, j is an integer larger than 0, $m > k > j$, $a_0-a_m$, $b_0-b_m$, $c_0-c_k$, $d_0-d_k$, and $e_k-e_{m+1}$ are either 1 or 0, $\cap$ denotes the AND operation, and $\cup$ the OR operation). Here, the number of bits is made equal between the branch metric and the path metric for the same reason as given in the second embodiment.

Thus, in the add-compare-select device of the ninth embodiment, the addition operations to obtain the path metrics and the simplified addition and comparison operations are performed concurrently, with the simplified additions being carried out on two groups, one with the high order bits and the other with the low order bits, a usual addition operation being performed on the high order bits and simple signal processing involving AND and OR operations being performed on the low order bits. This serves to reduce the time required for carry propagation and accomplishes a reduction in the signal processing time.

(10th Embodiment)

Figure 12:
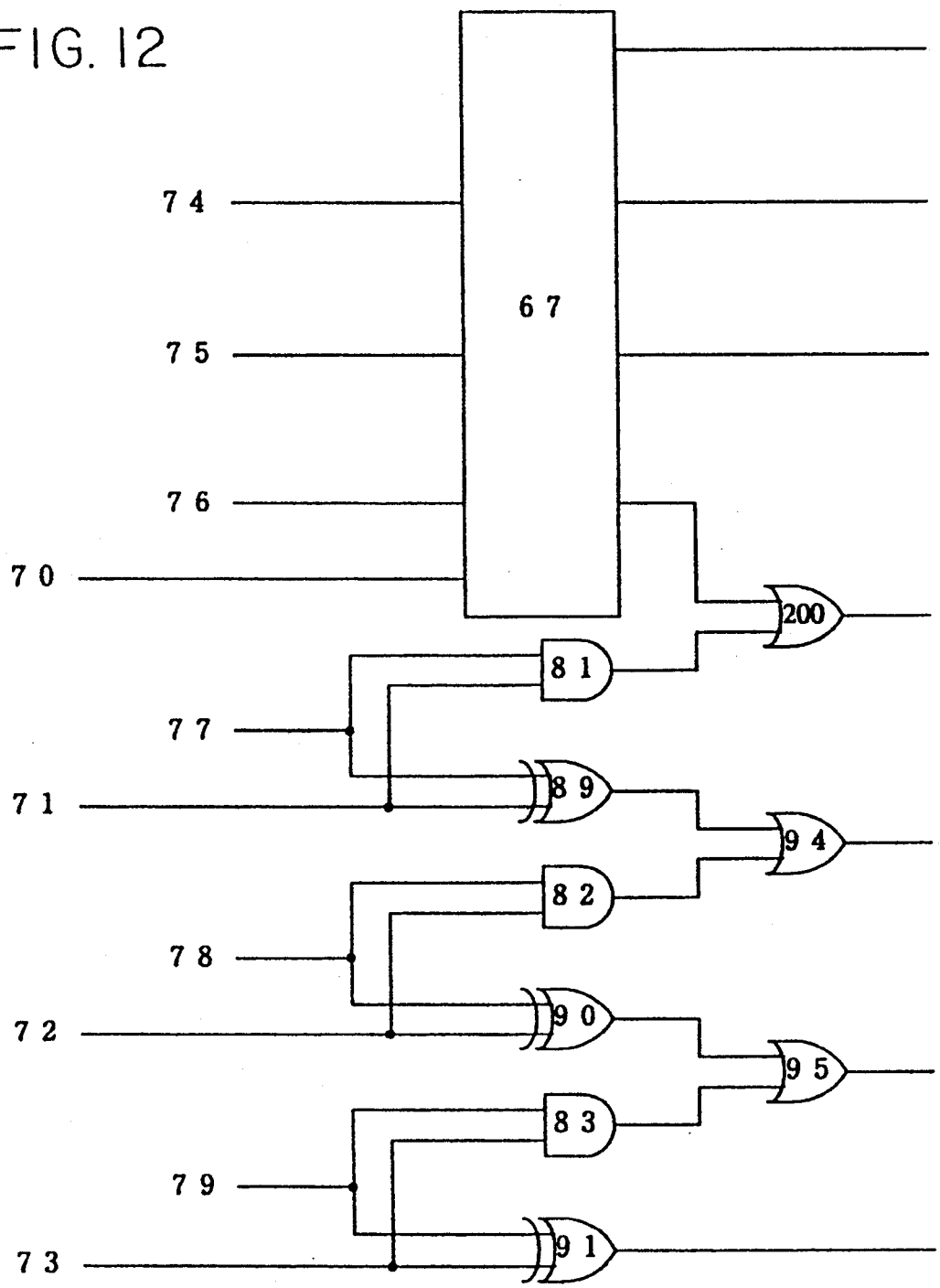
FIG. 12 is a diagram showing the configuration of simplified adding means in an add-compare-select device in a 10th embodiment according to the present invention.
Figure 13:
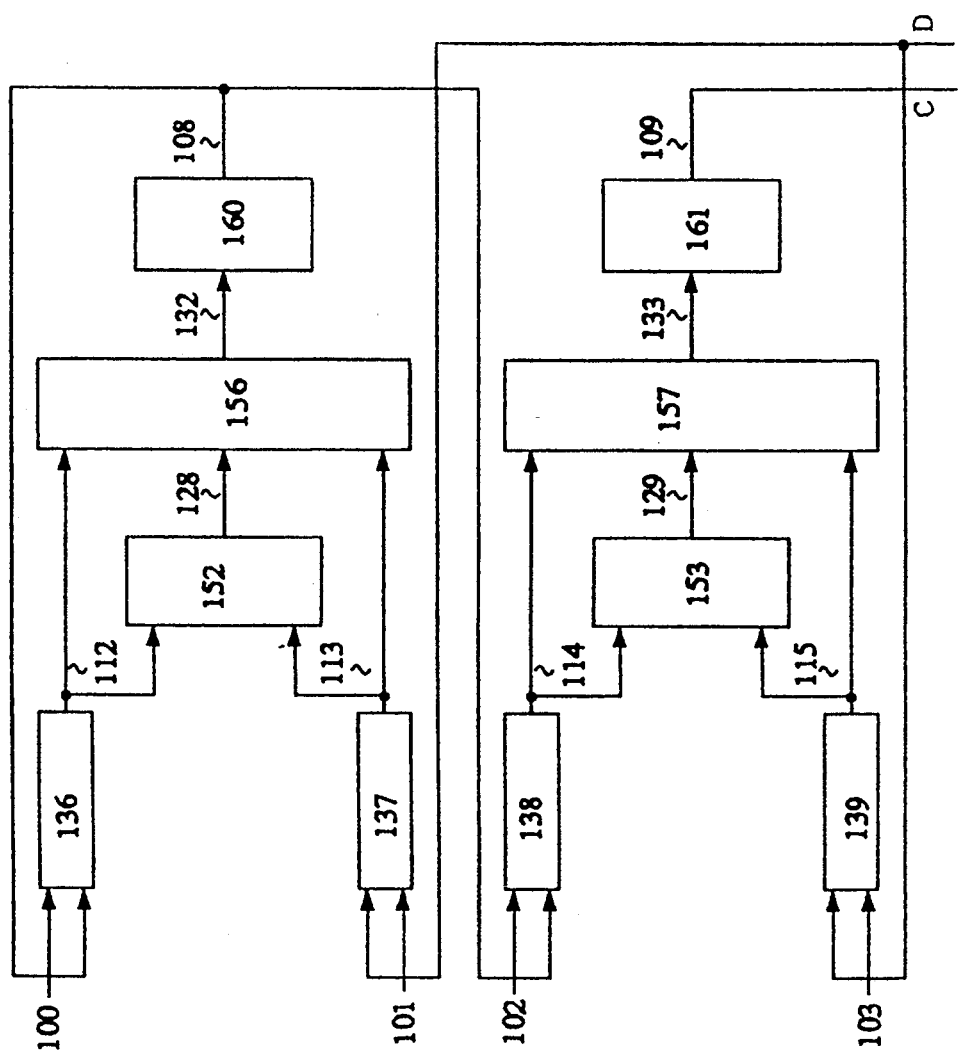
FIG. 13 is a diagram showing the configuration of an add-compare-select device (a portion thereof shown) according to the prior art.
Figure 14:
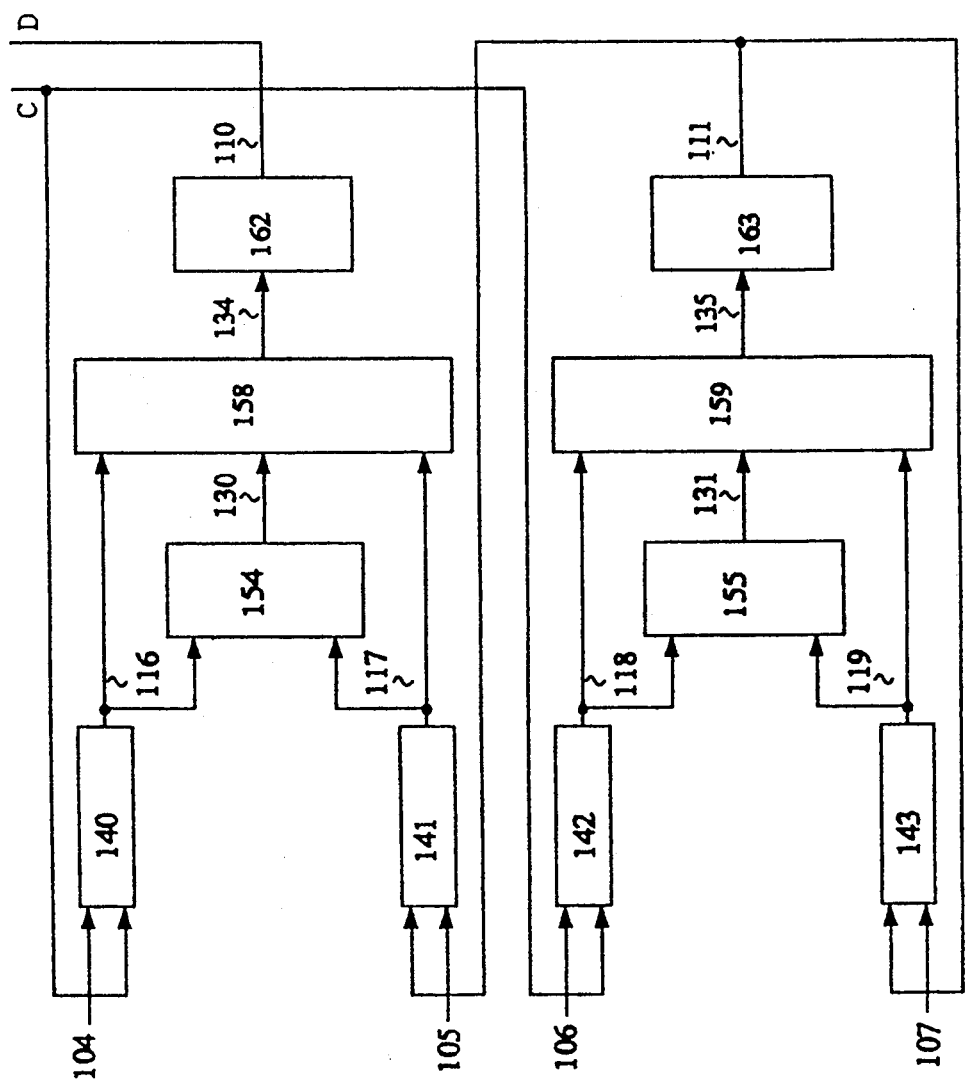
FIG. 14 is a diagram showing the configuration of the add-compare-select device (the remaining portion shown) according to the prior art.

FIG. 12 is a diagram showing the internal configuration of simplified adding means in an add-compare-select device in a 10th embodiment according to the present invention. The same parts as those of the simplified adding means shown in FIGS. 7 and 11 are designated by the same reference numerals, and detailed explanation of such parts is omitted here. Also, the configuration other than that of the simplified adding means is identical to that shown in FIGS. 1 and 2, and therefore, the same drawing and explanation will not be repeated here.

The simplified path metric output from the illustrated simplified adding means is a digital signal consisting of the first bit of the output of the adding means 67, the second bit of the same, the third bit of the same, the output of the OR means 200, the output of the OR means 94, the output of OR means 95, and the output of the exclusive-OR means 91, in this order counting from the most significant bit.

Next, the operation of the add-compare-select device of the 10th embodiment will be described below.

First, the adding means 36 to 43 add the branch metrics 0 to 7 and path metrics 8 to 11 in respective combinations, and obtain the new path metric candidates 12 to 19.

On the other hand, the simplified adding means 44 to 51 divide the branch metrics 0 to 7 and path metrics 8 to 11 into two groups, one consisting of high order bits and the other consisting of low order bits, and perform a usual addition operation on the high order bits and simple signal processing, i.e. AND, OR, and EXOR operations, on the low order bits, to obtain the simplified path metrics 20 to 27.

Next, the comparing means 52 to 55 compare the simplified path metrics 20 to 27 and output the selection information 28 to 31.

Thereafter, based on the selection information 28 to 31, the selecting means 56 to 59 each select one candidate from among the new path metric candidates 12 to 19, and the selected candidates are output as the new path metrics 32 to 35. As in the foregoing ninth embodiment, it is possible to select the new path metrics 32 to 35 by using the selection information 28 to 31 obtained from the simplified path metrics 20 to 27.

The memories 60 to 63 store the new path metrics 32 to 35 which are output as the path metrics at the next point in time.

To generalize the above, the branch metric [$a_m$, $a_{m-1}$, and the path metric [$b_m$, $b_{m-1}$, ..., $b_k$, $b_{k-1}$, ..., $b_1$, $b_0$] ($b_m$ is the most significant bit) are each divided into high order $m-k+1$ bits and low order k bits; then, a digital data signal [$e_{m+1}$, $e_m$, $e_{m-1}$, ..., $e_{k+1}$, $e_k$] ($e_{m+1}$ is the most significant bit) is obtained by adding the high order bits only, and from all the low order bits or part of the high order bits, digital signals [$c_k$, $c_{k-1}$, ..., $c_1$, $c_0$] = [$a_k \cap b_k$, $a_{k-1} \cap b_{k-1}$, ..., $a_1 \cap b_1$, $a_0 \cap b_0$] ($c_k$ is the most significant bit) and [$d_k$, $d_{k-1}$, ..., $d_1$, $d_0$] = [$a_k + b_k$, $a_{k-1} + b_{k-1}$, ..., $a_1 + b_1$, $a_0 + b_0$] ($d_k$ is the most significant bit), or designated high order bits of the respective signals, are obtained; and [$e_{m+1}$, $e_m$, $e_{m-1}$, ..., $e_{k+1}$, $e_k \cup c_k$, $d_k \cup c_{k-1}$, $d_{k-1} \cup c_{k-2}$, ..., $d_2 \cup c_1$, $d_1 \cup c_0$, $d_0$] ($e_{m+1}$ is the most significant bit), or designated high order bits thereof, is taken as the simplified path metric (m, k are positive integers, j is an integer larger than 0, $m > k > j$, $a_0-a_m$, $b_0-b_m$, $c_0-c_k$, $d_0-d_k$, and $e_k-e_{m+1}$ are either 1 or 0, $\cap$ denotes the AND operation, $\cup$ the OR operation, and + the EXOR operation). Here, the number of bits is made equal between the branch metric and the path metric for the same reason as given in the second embodiment.

Thus, in the add-compare-select device of the 10th embodiment, the addition operations to obtain the path metrics and the simplified addition and comparison operations are performed concurrently, with the simplified additions being carried out on two groups, one with the high order bits and the other with the low order bits, a usual addition operation being performed on the high order bits and simple signal processing involving AND, OR, and EXOR operations being performed on the low order bits. This serves to reduce the time required for carry propagation and accomplishes a reduction in the signal processing time.

In the above-described embodiments, examples of the simplified adding means have been described with reference to FIGS. 3, 4, 5, 6, 7, 8, 9, 10, 11, and 12, respectively, but it should be noted that these examples are only illustrative. For example, the simplified adding means may be constructed by simplifying the operation of the adding means. In other words, it should be constructed so as to attain a shorter signal processing time than the time required to obtain the usual path metric.

In each of the second to 10th embodiments, the simplified adding means has been described as one that carries out the simplified addition using all the bits in both the branch metric and path metric; alternatively, it may be constructed to perform the simplified addition using only a designated number of high order bits in each metric. In another alternative configuration, only a designated number of high order bits in the simplified path metric obtained as a result of the simplified addition may be used for comparison. With this number of bits, the frequency of occurrence of erroneous path metric selection will not become a practical problem.

In any of the above-described embodiments, the add-compare-select device has been described as one used in a Viterbi decoder with a constraint length 3 and code rate ½, but it will be appreciated that neither the constraint length nor the code rate is limited to this particular value. Furthermore, the application is not limited to the add-compare-select device used in a Viterbi decoder. In other words, the invention is applicable to any device constructed to perform, at each point in time, addition, comparison, and selection operations on a plurality of input branch metrics and a plurality of stored path metrics prescribed combinations to generate new path metrics, and to store the new path metrics as path metrics for the next point in time.

In any of the above-described embodiments, the adding means and the simplified adding means are constructed as independent elements, but alternatively, the preprocessing part of the adding means may be used to construct the simplified adding means. This is because the adding means often contains means, as a preprocessing part, for performing the ANDing and ORing on a bit by bit basis. When such a preprocessing part is used to construct the whole or part of the simplified adding means, simple hardware realization can be achieved.

In any of the above-described embodiments, the new path metric candidates are obtained by the adding means. In an alternative configuration, by processing the simplified path metrics it is possible to obtain exactly the same ones as the new path metric candidates obtained by the adding means. For example, in a configuration, such as described in the sixth embodiment, in which the simplified path metrics are obtained by dividing the branch metric and path metric into two groups, one with the high order bits and the other with the low order bits, and by performing addition operations within the respective groups, exactly the same ones as the new path metric candidates obtained by the adding means can be obtained by adding the carry, generated in the addition of the low order bits, to the result of the addition of the high order bits. It is apparent that the configuration for obtaining new path metric candidates in this manner falls within the scope of the add-compare-select device subsumed under the present invention. Furthermore, in the first to sixth embodiment, each signal has been described as being digital, but the construction may also be applied to analog signals. In any of the above-described embodiments, the simplified adding means is constructed using dedicated hardware, but alternatively, the same function may be implemented in software using a computer.

What is claimed is:

1. An add-compare-select device for generating a plurality of new path metrics at each point in time on the basis of prescribed combinations between a plurality of input branch metrics and a plurality of stored path metrics, comprising:

adding means for adding said branch metrics and said path metrics in said prescribed combinations, thereby obtaining new path metric candidates;

simplified calculating means for performing a simplified operation, as compared to an addition operation of said adding means, on said branch metrics and said path metrics in said prescribed combinations, thereby obtaining simplified path metrics;

comparing means for comparing a plurality of simplified path metrics thus obtained;

selecting means for selecting a path metric candidate presented by a result of the addition in said adding means, the selected path metric candidate corresponding to the simplified path metric judged as being the smallest on the basis of a result of the comparing; and storing means for storing the thus selected path metric candidate for use as a new path metric at the next point in time.

2. An add-compare-select device according to claim 1, wherein said branch metrics and said path metrics are digital signals, and said simplified operation consists of adding designated high order bits of said branch metrics and designated high order bits of said path metrics.

3. An add-compare-select device according to claim 1, wherein said branch metrics and said path metrics are digital signals, and said simplified operation consists of logic operations of ANDing and ORing said branch metrics with said path metrics.

4. An add-compare-select device according to claim 1, wherein said branch metrics and said path metrics are digital signals, and said simplified operation consists of logic operations of ANDing and ORing said branch metrics with said path metrics and further ORing the ANDed results with the OR results.

5. An add-compare-select device according to claim 1, wherein said branch metrics and said path metrics are digital signals, and said simplified operation consists of logic operations of ANDing and EXORing said branch metrics with said path metrics.

6. An add-compare-select device according to claim 1, wherein said branch metrics and said path metrics are digital signals, and said simplified operation consists of logic operations of ANDing and EXORing said branch metrics with said path metrics and further ORing the ANDed results with the EXORed results.

7. An add-compare-select device according to claim 1, wherein said branch metrics and said path metrics are digital signals, and said simplified calculating means divides each of said branch metrics and each of said path metrics into a designated number of high order bits and a designated number of low order bits, performs operations on the high order bits and on all or higher part of the low order bits, and takes a whole or a higher part of the calculation result thereof as a simplified path metric.

8. An add-compare-select device according to claim 7, wherein said operations performed on the high order bits or on all or higher part of the low order bits consist of logic operations of ANDing and ORing.

9. An add-compare-select device according to claim 7, wherein said operations performed on the high order bits or on all or higher part of the low order bits consist of logic operations of ANDing and ORing and further ORing the ANDed results with the ORed results.

10. An add-compare-select device according to claim 7, wherein said operations performed on the high order bits or on all or higher part of the low order bits consist of logic operations of ANDing and EXORing.

11. An add-compare-select device according to claim 7, wherein said operations performed on the high order bits or on all or higher part of the low order bits consist of logic operations of ANDing and EXORing and further EXORing the ANDed results with the EXOR results.

* * * * *